US012762996B2

(12) United States Patent
Fang et al.

(10) Patent No.: US 12,762,996 B2
(45) Date of Patent: Oct. 13, 2026

(54) PIXEL DRIVING CIRCUIT, DISPLAY PANEL AND DRIVING METHOD

(71) Applicants: Chengdu BOE Optoelectronics Technology Co., Ltd., Chengdu (CN); BOE Technology Group Co., Ltd., Beijing (CN)

(72) Inventors: Fei Fang, Beijing (CN); Zhu Wang, Beijing (CN); Ling Shi, Beijing (CN); Weifeng Zhou, Beijing (CN); Mingkun Yang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 220 days.

(21) Appl. No.: 18/837,814

(22) PCT Filed: Sep. 26, 2023

(86) PCT No.: PCT/CN2023/121752
§ 371 (c)(1),
(2) Date: Aug. 12, 2024

(87) PCT Pub. No.: WO2025/065286
PCT Pub. Date: Apr. 3, 2025

(65) Prior Publication Data
US 2026/0196158 A1 Jul. 9, 2026

(51) Int. Cl.
*G09G 3/30* (2006.01)
*H10D 86/40* (2025.01)
*H10D 86/60* (2025.01)

(52) U.S. Cl.
CPC ............ *G09G 3/30* (2013.01); *H10D 86/441* (2025.01); *H10D 86/481* (2025.01);
(Continued)

(58) Field of Classification Search
None
See application file for complete search history.

(56) References Cited

U.S. PATENT DOCUMENTS

2008/0169754 A1 7/2008 Yang et al.
2022/0302238 A1* 9/2022 Zhou .................. H10K 59/1213
(Continued)

FOREIGN PATENT DOCUMENTS

CN 103839513 A 6/2014
CN 104157240 A 11/2014
(Continued)

*Primary Examiner* — Stephen T. Reed
(74) *Attorney, Agent, or Firm* — IPro, PLLC

(57) ABSTRACT

Provided are a pixel driving circuit, a display panel and a driving method. The pixel driving circuit includes: a driver transistor, a light-emitting device, a compensation capacitor, a threshold compensation sub-circuit, a data writing sub-circuit, a conduction control sub-circuit and a light-emitting control sub-circuit. The threshold compensation sub-circuit, in response to a signal at the compensation signal terminal, provides the threshold voltage of the driver transistor to the first end of the compensation capacitor; the conduction control sub-circuit, in response to the signal at the conduction control terminal, establishes the conducting path between the power signal terminal and the second end of the compensation capacitor; and the light-emitting control sub-circuit, in response to the signal at the light-emitting control signal terminal, provides the drive current generated by the driver transistor to the light-emitting device.

20 Claims, 15 Drawing Sheets

(52) U.S. Cl.
CPC ..... *H10D 86/60* (2025.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2330/021* (2013.01); *G09G 2340/0435* (2013.01)

(56) References Cited

U.S. PATENT DOCUMENTS

| | | | | |
|---|---|---|---|---|
| 2023/0165069 | A1* | 5/2023 | Liu | H10K 59/1213<br>345/690 |
| 2024/0212601 | A1* | 6/2024 | Chen | G09G 3/3233 |
| 2024/0321196 | A1* | 9/2024 | Wang | G09G 3/20 |

FOREIGN PATENT DOCUMENTS

| | | | |
|---|---|---|---|
| CN | 104658484 | A | 5/2015 |
| CN | 105489167 | A | 4/2016 |
| CN | 107274825 | A | 10/2017 |
| CN | 108806605 | A | 11/2018 |
| CN | 108877672 | A | 11/2018 |
| CN | 111179854 | A | 5/2020 |
| CN | 111402808 | A | 7/2020 |
| CN | 113838415 | A | 12/2021 |
| CN | 113871420 | A | 12/2021 |
| CN | 114175257 | A | 3/2022 |
| CN | 114550653 | A | 5/2022 |
| CN | 115623881 | A | 1/2023 |

* cited by examiner

PIXEL DRIVING CIRCUIT, DISPLAY PANEL AND DRIVING METHOD

CROSS-REFERENCE TO RELATED APPLICATIONS

The disclosure is a National Stage of International Application No. PCT/CN2023/121752, filed on Sep. 26, 2023, which is hereby incorporated by reference in its entirety.

TECHNICAL FIELD

The present disclosure relates to the field of display technology and provides a pixel driving circuit, a display panel and a driving method.

BACKGROUND

In the driving process of the pixel driving circuit in the related art, the compensation of the threshold voltage of the driver transistor is synchronously completed at the stage in which the data voltage is written to the gate of the driver transistor. However, due to the long time required for the threshold voltage compensation, as a refresh rate of a display screen increases, the compensation period per unit time is greatly reduced, which results in insufficient compensation of the threshold voltage of the driver transistor, and further results in a poor display effect of the display screen.

SUMMARY

Embodiments of the present disclosure provide a pixel driving circuit, a display panel and a driving method, for compensating a threshold voltage and writing a data voltage in different time periods to enhance the compensation effect of the threshold voltage at the high refresh rate.

The specific technical solutions provided in the disclosure are as follows.

In a first aspect, an embodiment of the present disclosure provides a pixel driving circuit, including: a driver transistor, a light-emitting device, a compensation capacitor, a threshold compensation sub-circuit, a data writing sub-circuit, a conduction control sub-circuit, and a light-emitting control sub-circuit. The threshold compensation sub-circuit is mutually coupled to a gate of the driver transistor and a first end of the compensation capacitor, and is configured to provide a threshold voltage of the driver transistor to the first end of the compensation capacitor in response to a signal at a compensation signal terminal; the data writing sub-circuit is coupled to a second end of the compensation capacitor, and is configured to provide a data voltage at a data signal terminal to the second end of the compensation capacitor in response to a signal at a scan signal terminal; the compensation capacitor is configured to stabilize voltages at the first end and the second end; the conduction control sub-circuit is coupled to the second end of the compensation capacitor and a power signal terminal, and is configured to establish a conducting path between the power signal terminal and the second end of the compensation capacitor in response to a signal at a conduction control terminal; and the light-emitting control sub-circuit is coupled to the driver transistor and the light-emitting device, and is configured to provide a drive current generated by the driver transistor to the light-emitting device in response to a signal at a light-emitting control signal terminal.

Optionally, the conduction control sub-circuit includes: a first transistor; and a control end of the first transistor is coupled to the conduction control terminal, a first end of the first transistor is coupled to the second end of the compensation capacitor, and a second end of the first transistor is coupled to the power signal terminal.

Optionally, the data writing sub-circuit provides the data voltage at the data signal terminal to the second end of the compensation capacitor in response to a first active level of the signal at the scan signal terminal; and the threshold compensation sub-circuit provides the threshold voltage of the driver transistor to the first end of the compensation capacitor in response to a second active level of the signal at the compensation signal terminal; where a time period corresponding to the first active level is provided within a time period corresponding to the second active level.

Optionally, a duration in which the first active level is high is less than a duration in which the second active level is low.

Optionally, the threshold compensation sub-circuit includes: a second transistor; and a control end of the second transistor is coupled to the compensation signal terminal, a first end of the second transistor is coupled to the first end of the compensation capacitor, and a second end of the second transistor is coupled to a second end of the driver transistor.

Optionally, the data writing sub-circuit includes: a third transistor; and a control end of the third transistor is coupled to the scan signal terminal, a first end of the third transistor is coupled to the data signal terminal, and a second end of the third transistor is coupled to the second end of the compensation capacitor.

Optionally, the light-emitting control sub-circuit includes: a fourth transistor and a fifth transistor; a control end of the fourth transistor is coupled to the light-emitting control signal terminal, a first end of the fourth transistor is coupled to the power signal terminal, and a second end of the fourth transistor is coupled to a first end of the driver transistor; and a control end of the fifth transistor is coupled to the conduction control terminal, a first end of the fifth transistor coupled to a second end of the driver transistor, and a second end of the fifth transistor is coupled to an anode of the light-emitting device.

Optionally, the pixel driving circuit further includes: a first initialization sub-circuit; and the first initialization sub-circuit is coupled to a first end of the driver transistor, and is configured to provide a signal at a first initialization signal terminal to the first end of the driver transistor in response to a signal at a first reset signal terminal.

Optionally, the first initialization sub-circuit includes: a sixth transistor; and a control end of the sixth transistor is coupled to the first reset signal terminal, a first end of the sixth transistor is coupled to the first end of the driver transistor, and a second end of the sixth transistor is coupled to the first initialization signal terminal.

Optionally, the pixel driving circuit further includes: a second initialization sub-circuit; and the second initialization sub-circuit is coupled to an anode of the light-emitting device, and is configured to provide a signal at a second initialization signal terminal to the anode of the light-emitting device in response to a signal at a second reset signal terminal.

Optionally, the second initialization sub-circuit includes: a seventh transistor; and a control end of the seventh transistor is coupled to the second reset signal terminal, a first end of the seventh transistor is coupled to the anode of the light-emitting device, and a second end of the seventh transistor is coupled to the second initialization signal terminal.

Optionally, the pixel driving circuit further includes: a third initialization sub-circuit; and the third initialization sub-circuit is coupled to the first end of the compensation capacitor, and is configured to provide a signal at a third initialization signal terminal to the first end of the compensation capacitor in response to a signal at a third reset signal terminal.

Optionally, the third initialization sub-circuit includes: an eighth transistor; and a control end of the eighth transistor is coupled to the third reset signal terminal, a first end of the eighth transistor is coupled to the first end of the compensation capacitor, and a second end of the eighth transistor is coupled to the third initialization signal terminal.

In a second aspect, embodiments of the present disclosure further provide a display panel, including: a base substrate, including a plurality of sub-pixels; where the sub-pixel includes the above any pixel driving circuit; the pixel driving circuit includes: the driver transistor, a first transistor, a third transistor, and the compensation capacitor; a first end of the first transistor is coupled to the second end of the compensation capacitor, a second end of the third transistor is coupled to the second end of the compensation capacitor, and the gate of the driver transistor is coupled to the first end of the compensation capacitor; and an orthographic projection of an active layer of the third transistor on the base substrate is located between an orthographic projection of an active layer of the driver transistor on the base substrate and an orthographic projection of an active layer of the first transistor on the base substrate.

Optionally, the display panel includes: a first semiconductor layer, a first conductive layer, a second conductive layer, and a second semiconductor layer; the first semiconductor layer on the base substrate includes the active layer of the first transistor and the active layer of the driver transistor; the first conductive layer is disposed at a side of the base substrate facing away from the first semiconductor layer, and includes a gate of the first transistor, the gate of the driver transistor and a first signal line; the second conductive layer is disposed at a side of the base substrate facing away from the first conductive layer, and includes the second end of the compensation capacitor, a gate of the third transistor and a fifth signal line; and the second semiconductor layer is disposed at a side of the base substrate facing away from the second conductive layer, and includes the active layer of the third transistor.

Optionally, an orthographic projection of the first signal line on the base substrate and an orthographic projection of the active layer of the first transistor on the base substrate have an overlapping region; and the first signal line in the overlapping region serves as a gate of the first transistor.

Optionally, the active layer of the first transistor includes a first active portion and a second active portion, the first active portion extends in a first direction, and the second active portion extends in a second direction; and the orthographic projection of the first signal line on the base substrate and an orthographic projection of the first active portion on the base substrate have the overlapping region.

Optionally, the display panel further includes: a third conductive layer; and the third conductive layer is disposed at a side of the base substrate facing away from a second semiconductor layer, the third conductive layer includes a power signal line connected to the power signal terminal, and the power signal line covers the overlapping region.

Optionally, the third conductive layer includes a first connection portion, the second conductive layer includes a second connection portion, a first insulating layer is provided between the third conductive layer and the second conductive layer, and a second insulating layer is provided between the second conductive layer and the first conductive layer; the power signal line is connected to the second connection portion through a first via passing through the first insulating layer; and the second connection portion is connected to the active layer of the first transistor through a second via passing through the second insulating layer.

In a third aspect, embodiments of the present disclosure further provide a driving method for the above any pixel driving circuit, including: providing, by the threshold compensation sub-circuit, the threshold voltage of the driver transistor to the first end of the compensation capacitor in response to the signal at the compensation signal terminal; providing, by the data writing sub-circuit, the data voltage at the data signal terminal to the second end of the compensation capacitor in response to the signal at the scan signal terminal; stabilizing, by the compensation capacitor, the voltages at the first end and the second end; establishing the conducting path between the power signal terminal and the second end of the compensation capacitor, by the conduction control sub-circuit, in response to the signal at the conduction control terminal; and providing, by the light-emitting control sub-circuit, the drive current generated by the driver transistor to the light-emitting device in response to the signal at the light-emitting control signal terminal.

The beneficial effects of the present disclosure are as follows.

In summary, in the embodiments of the present disclosure, a pixel driving circuit, a display panel and a driving method are provided. The pixel driving circuit includes: a driver transistor, a light-emitting device, a compensation capacitor, a threshold compensation sub-circuit, a data writing sub-circuit, a conduction control sub-circuit, and a light-emitting control sub-circuit. The threshold compensation sub-circuit provides a threshold voltage of the driver transistor to the first end of the compensation capacitor in response to a signal at the compensation signal terminal. The data writing sub-circuit provides the data voltage at the data signal terminal to the second end of the compensation capacitor in response to the signal at the scan signal terminal. The conduction control sub-circuit establishes the conducting path between the power signal terminal and the second end of the compensation capacitor in response to the signal at the conduction control terminal. The light-emitting control sub-circuit provides the drive current generated by the driver transistor to the light-emitting device in response to the signal at the light-emitting control signal terminal. The setting of the compensation capacitor realizes the time division of the threshold compensation and the data writing, which realizes the high-frequency refresh while satisfying the display of the light-emitting device.

Other features and advantages of the present disclosure will be set forth in the subsequent description, and partly become apparent from the description or will be understood by implementation of the present disclosure. The objectives and other advantages of the present disclosure may be realized and obtained by the structures as particularly indicated in the description, claims, and accompanying drawings.

BRIEF DESCRIPTION OF FIGURES

The accompanying drawings illustrated herein are used for providing a further understanding of the present disclosure and form a part of the present disclosure. The schematic embodiments of the present disclosure and their illustrations are used for explaining the present disclosure and do not constitute an undue limitation of the present disclosure.

DETAILED DESCRIPTION

In order to make objectives, technical solutions and advantages of embodiments of the present disclosure clearer, technical solutions of the present disclosure will be described clearly and completely in the following in combination with accompanying drawings in embodiments of the present disclosure. Obviously, the described embodiments are part of the embodiments of the technical solutions of the present disclosure, and not all of the embodiments. Based on the embodiments in the present disclosure, all other embodiments obtained by a person of ordinary skill in the art without creative labor fall within the scope of protection of technical solutions of the present disclosure.

The terms "first", "second", etc., in the description and claims of the present disclosure and the above accompanying drawings are used to distinguish similar objects, and need not be used to describe a particular order or sequence. It should be understood that the data so used may be interchanged, where appropriate, so that the embodiments of the present disclosure described herein can be implemented using an order other than those illustrated or described herein.

In the related art, in a driving process of the pixel driving circuit, compensation of a threshold voltage of a driver transistor is synchronously accomplished at a stage where a data voltage is written to a gate of the driver transistor. However, due to the long time required for the above threshold voltage compensation, as a refresh rate of a display screen increases, a compensation period per unit time is greatly reduced, which results in insufficient compensation of the threshold voltage of the driver transistor, and further results in a poor display effect of the display screen.

Figure 1:
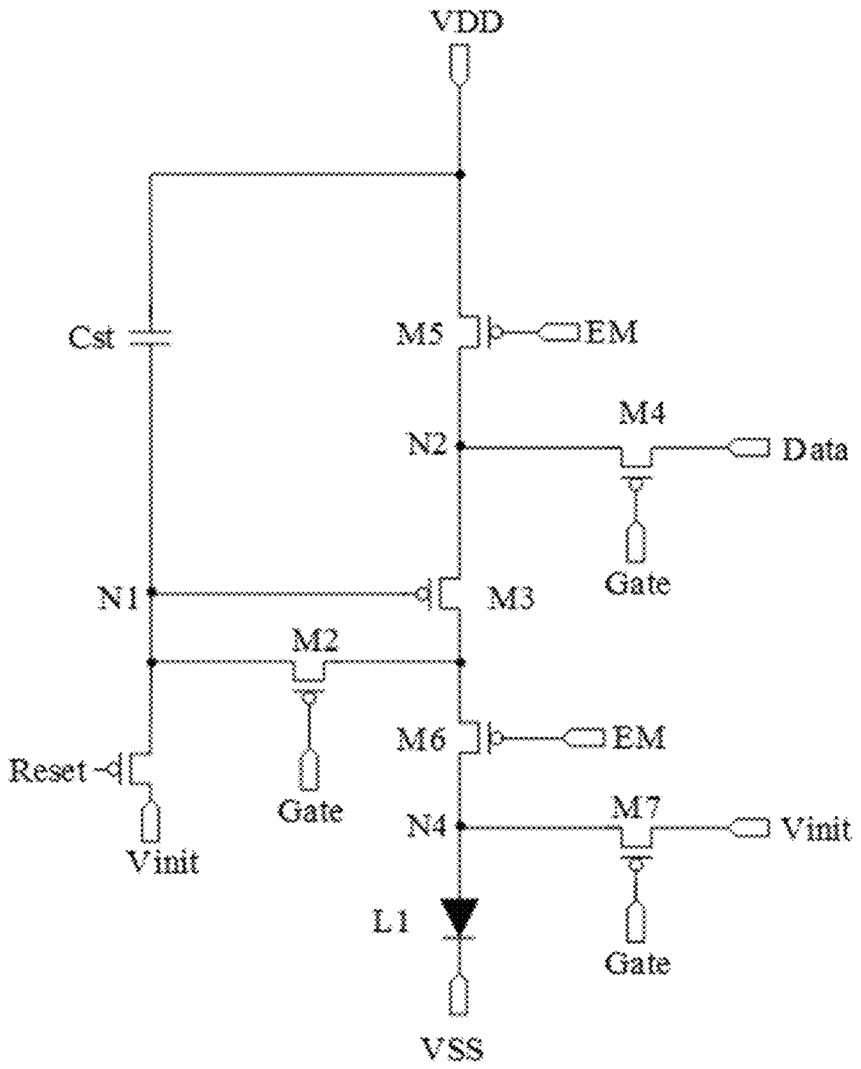
FIG. 1 shows a schematic diagram of connection of a pixel driving circuit in the related art.

Referring to FIG. 1 for the detailed description of the pixel driving circuit shown in FIG. 1, a transistor M3 in FIG. 1 is a driver transistor. In a working process of the driver transistor, a threshold voltage of the driver transistor M3 is written to a gate of the driver transistor via a conducted transistor M2, and at the same time, a data voltage is written to the gate of the driver transistor via a conducted transistor T4. When the above driver transistor is located in a display screen which has a high refresh rate, it often occurs that the compensation of the threshold voltage is still insufficient at an end of the compensation period, thereby affecting the display effect of the display screen.

The preferred embodiments of the present disclosure are described in detail below in combination with the accompanying drawings.

Figure 2:
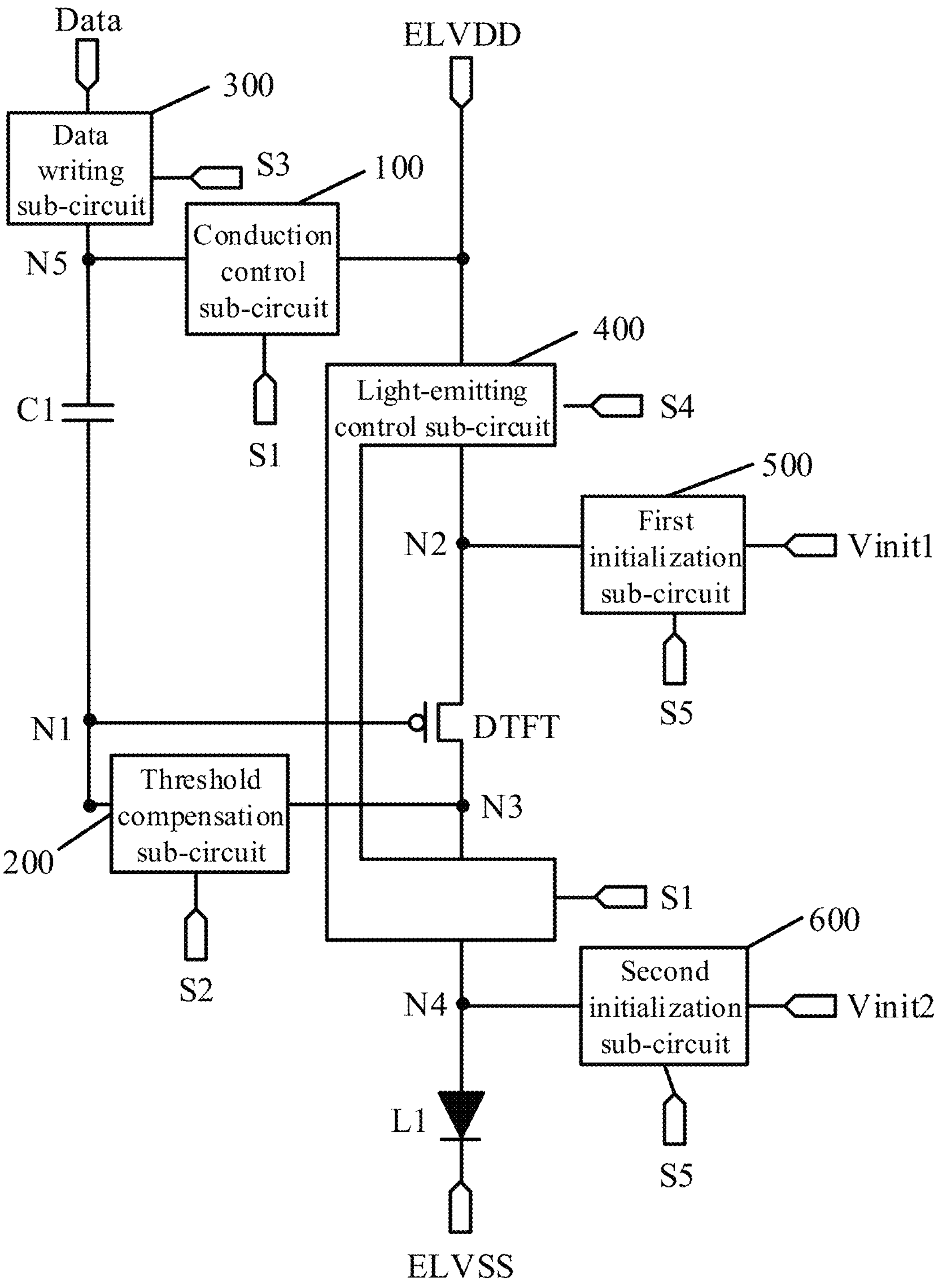
FIG. 2 shows a schematic diagram of connection of a pixel driving circuit according to the embodiments of the present disclosure.

Referring to FIG. 2, a pixel driving circuit provided in embodiments of the present application includes: a driver transistor DTFT, a light-emitting device L1, a compensation capacitor C1, a threshold compensation sub-circuit 200, a data writing sub-circuit 300, a conduction control sub-circuit 100, and a light-emitting control sub-circuit 400.

In the implementation, the conduction control sub-circuit 100 is coupled to a second end of the compensation capacitor C1 and a power signal terminal ELVDD, and is configured to make conduction between the power signal terminal ELVDD with the second end of the compensation capacitor C1 in response to a signal at the conduction control terminal S1.

Figure 3:
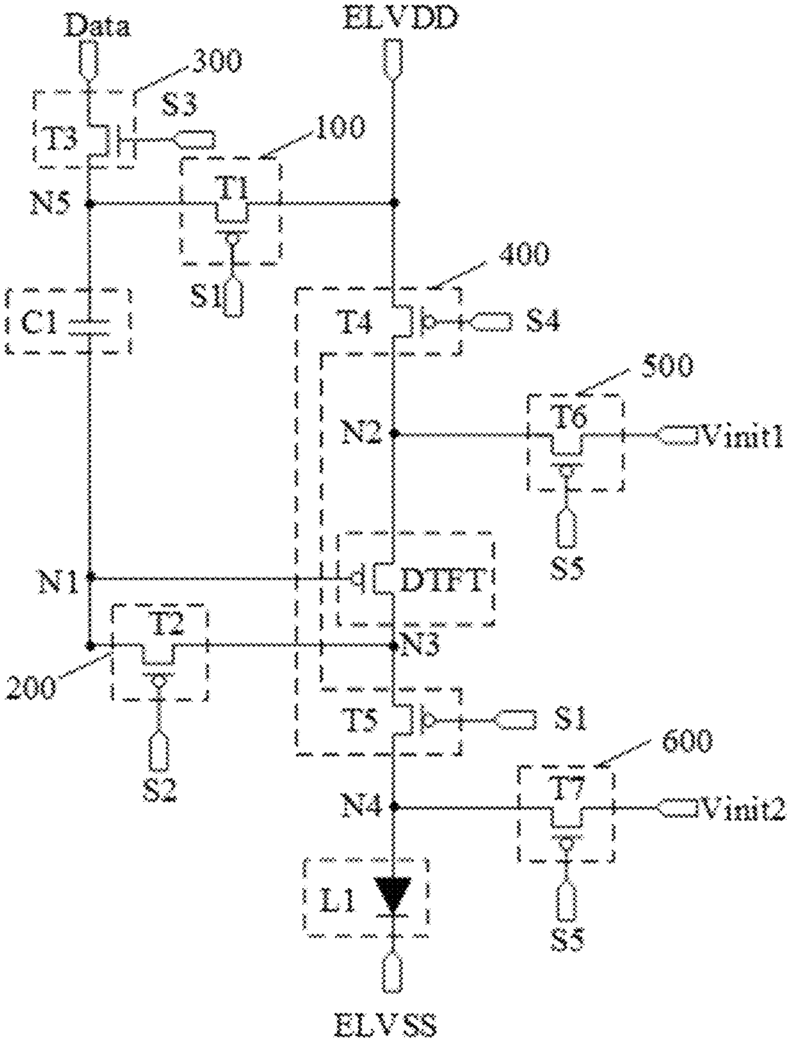
FIG. 3 shows a circuit connection diagram of a pixel driving circuit according to the embodiments of the present disclosure.

Referring to FIG. 3, the above conduction control sub-circuit 100 includes: a first transistor T1.

The connection relationship between the first transistor T1 and other components in FIG. 3 is as follows: a control end of the first transistor T1 is coupled to the conduction control terminal S1, a first end of the first transistor T1 is coupled to the second end of the compensation capacitor C1, and a second end of the first transistor T1 is coupled to the power signal terminal ELVDD.

In the implementation, when the signal at the conduction control terminal S1 is at a low level, the control end of the first transistor T1 is conducted, and a level of the power signal terminal ELVDD is provided to the second end of the compensation capacitor C1 via the conducted first transistor T1.

In the implementation, the above threshold compensation sub-circuit 200 is mutually coupled to the gate of the driver transistor DTFT and the first end of the compensation capacitor C1, and is configured to provide a threshold voltage of the driver transistor DTFT to the first end of the compensation capacitor C1 in response to a signal at the compensation signal terminal S2.

Referring to FIG. 3, the above threshold compensation sub-circuit 200 includes: a second transistor T2.

The connection relationship between the second transistor T2 and other components in FIG. 3 is as follows: a control end of the second transistor T2 is coupled to the compensation signal terminal S2, a first end of the second transistor T2 is coupled to the first end of the compensation capacitor C1, and a second end of the second transistor T2 is coupled to the second end of the driver transistor DTFT.

It should be noted that, since the second transistor T2 is directly connected to the first end of the compensation capacitor C1, i.e., the gate of the driver transistor DTFT, the above second transistor T2 can be replaced with an indium gallium zinc oxide (IGZO) tube in the implementation process, which ensures that a potential of the gate of the driver transistor DTFT does not change due to leakage of the second transistor T2.

In the implementation process, when the signal at the compensation signal terminal S2 is at a low level, the control end of the second transistor T2 is at a low level, the second transistor T2 is conducted, and the threshold voltage of the driver transistor DTFT is provided to the first end of the compensation capacitor C1 via the conducted second transistor T2.

The above data writing sub-circuit 300 is coupled to the second end of the compensation capacitor C1, and is configured to provide a data voltage at the data signal terminal Data to the second end of the compensation capacitor C1 in response to a signal at a scan signal terminal S3.

Referring to FIG. 3, the data writing sub-circuit 300 includes: a third transistor T3.

The connection relationship between the third transistor T3 and other components in FIG. 3 is as follows: a control end of the third transistor T3 is coupled to the scan signal terminal S3, a first end of the third transistor T3 is coupled to the data signal terminal Data, and a second end of the third transistor T3 is coupled to the second end of the compensation capacitor C1.

Exemplarily, in the embodiments of the present application, the above third transistor T3 is an N-type transistor, and a material of an active layer of the third transistor is a metal oxide semiconductor material, such as IGZO. When the third transistor T3 is an N-type transistor, other transistors are P-type transistors, and materials of the active layers of other transistors may also be the low temperature polysilicon (LTPS) and the like. No specific limitation is made herein.

In the implementation process, when the scan signal terminal S3 is at a high level, the control end of the third transistor T3 is at a high level, the third transistor T3 is conducted, and the data voltage at the data signal terminal Data is provided to the second end of the compensation capacitor C1 via the conducted third transistor T3.

It is to be added that, in the embodiments of the present application, in order to set the threshold compensation process and the data writing process at different time periods respectively, active time periods of active levels of the data writing sub-circuit 300 and the threshold compensation sub-circuit 200 are set as follows.

In the specific implementation, the data writing sub-circuit 300 provides the data voltage at the data signal terminal Data to the second end of the compensation capacitor C1 in response to a first active level of the signal at the scan signal terminal S3.

That is, a duration for writing the data voltage to the second end of the compensation capacitor C1 is a duration corresponding to the above first active level.

Correspondingly, the threshold compensation sub-circuit 200 provides the threshold voltage of the driver transistor DTFT to the first end of the compensation capacitor C1 in response to a second active level of the signal at the compensation signal terminal S2.

That is, a duration for writing the threshold voltage to the first end of the compensation capacitor C1 is a duration corresponding to the above second active level.

Since, the type of the third transistor is not the same as the type of the other transistors, in some embodiments, the above first active level may be a high level, and correspondingly, the above second active level is a low level. In other embodiments, the above first active level may be a low level, and correspondingly, the above second active level is a high level.

It should be noted that a time period corresponding to the above first active level is provided within a time period corresponding to the second active level.

That is, in the implementation, a duration of the time period corresponding to the first active level is set to be shorter than a duration of the time period corresponding to the second active level, thereby ensuring that the duration for writing the threshold voltage to the circuit is longer than the duration for writing the data voltage to the circuit.

Further, a duration in which the first active level is high is smaller than a duration in which the second active level is low.

Referring to FIG. 3, when the second transistor T2 is an N-type transistor and the third transistor T3 is a P-type transistor, the above first active level is active at a high level and the above second active level is active at a low level. In order to ensure that the duration for writing the threshold voltage is sufficiently long, the duration when the above first active level is at a high level is smaller than the duration when the second active level is at a low level.

The above compensation capacitor C1 is configured to stabilize the voltages at the first end and the second end.

Referring to FIG. 3, in the implementation, after the threshold voltage of the driver transistor DTFT is provided to the first end of the compensation capacitor C1 via the conducted second transistor T2, and after the data voltage is written to the second end of the compensation capacitor C1 via the conducted third transistor T3, the first transistor T1 is conducted under the control of the conduction control terminal S1, and the voltage at the first end of the compensation capacitor C1 jumps from a data voltage to a voltage of the power signal terminal ELVDD. In order to maintain a balance between the voltages at the first end and the second end of the above compensation capacitor C1, via a bootstrap effect of the compensation capacitor C1, the amount of voltage jump at the above first end is coupled to the second end of the compensation capacitor C1.

In the implementation, the driver transistor DTFT generates a drive current based on the above threshold voltage and the data voltage.

The above-mentioned light-emitting control sub-circuit is coupled to the driver transistor DTFT and the light-emitting device L1, and is configured to provide the drive current generated by the driver transistor DTFT to the light-emitting device L1 in response to a signal at the light-emitting control signal terminal S4.

Referring to FIG. 3, the light-emitting control sub-circuit includes: a fourth transistor T4 and a fifth transistor T5.

The connection relationship between the fourth transistor T4 and other components in FIG. 3 is as follows: a control end of the fourth transistor T4 is coupled to the light-emitting control signal terminal S4, a first end of the fourth transistor T4 is coupled to the power signal terminal ELVDD, and a second end of the fourth transistor T4 is coupled to a first end of the driver transistor DTFT.

In the implementation process, when the light-emitting control signal terminal S4 is at a low level, the fourth transistor T4 is conducted, and the signal at the power signal terminal ELVDD is provided to the driver transistor DTFT via the conducted fourth transistor T4.

The connection relationship between the fifth transistor T5 and other components in FIG. 3 is as follows: a control end of the fifth transistor T5 is coupled to the conduction control terminal S1, a first end of the fifth transistor T5 is coupled to a second end of the driver transistor DTFT, and a second end of the fifth transistor T5 is coupled to an anode of the light-emitting device L1.

In the implementation process, when the signal at the conduction control terminal S1 is at a low level, the fifth transistor T5 is conducted, and the drive current generated by the driver transistor DTFT is provided to the anode of the light-emitting device L1 via the conducted fifth transistor T5, to cause the light-emitting device L1 to emit light.

Figure 4:
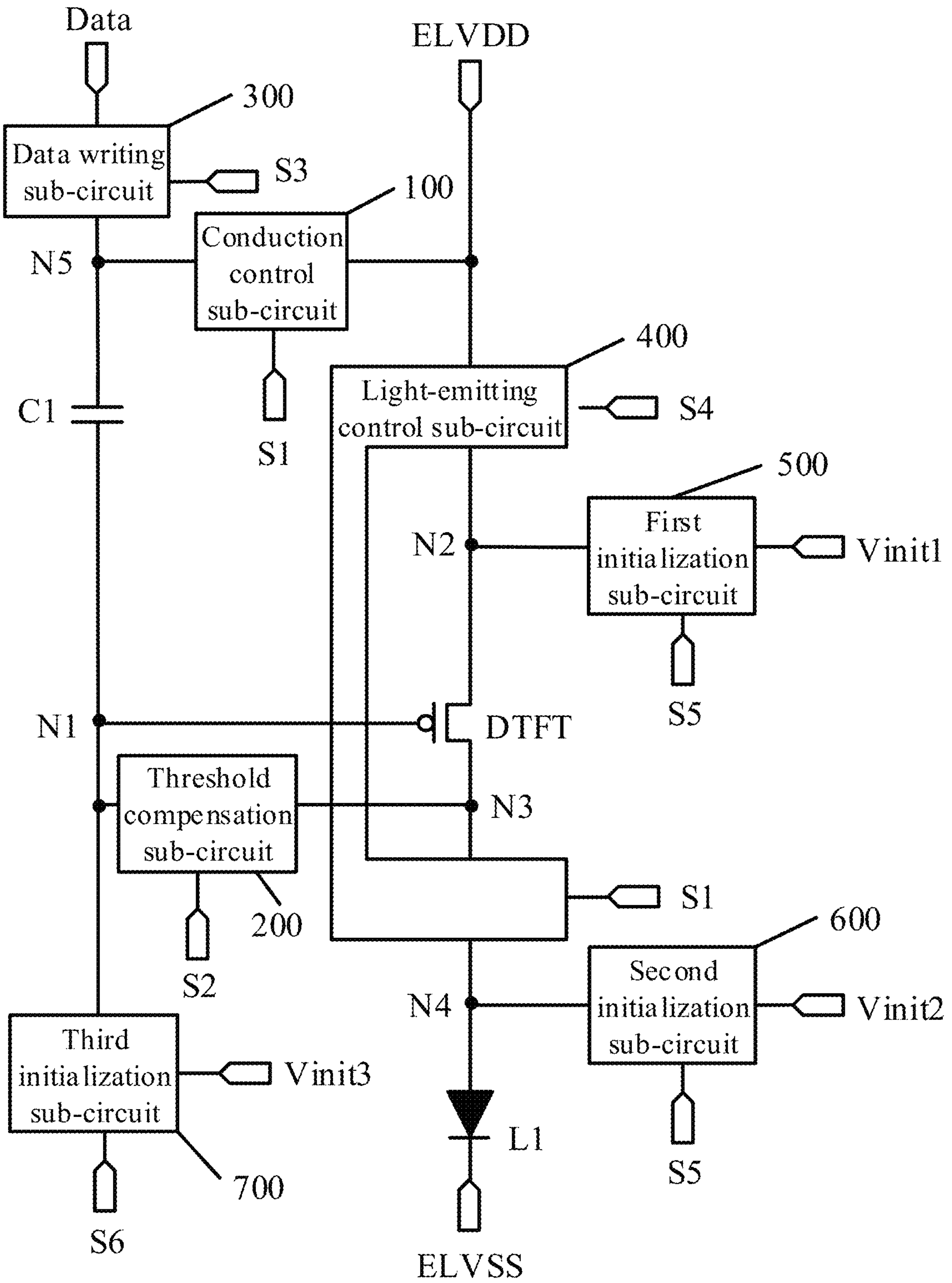
FIG. 4 shows another schematic diagram of connection of a pixel driving circuit according to the embodiments of the present disclosure.

Furthermore, referring to FIG. 4, the above pixel driving circuit further includes a first initialization sub-circuit 500. The above first initialization sub-circuit 500 is coupled to the first end of the driver transistor DTFT, and is configured to provide a signal at a first initialization signal terminal Vinit1 to the first end of the driver transistor DTFT in response to a signal at a first reset signal terminal S5.

Figure 5:
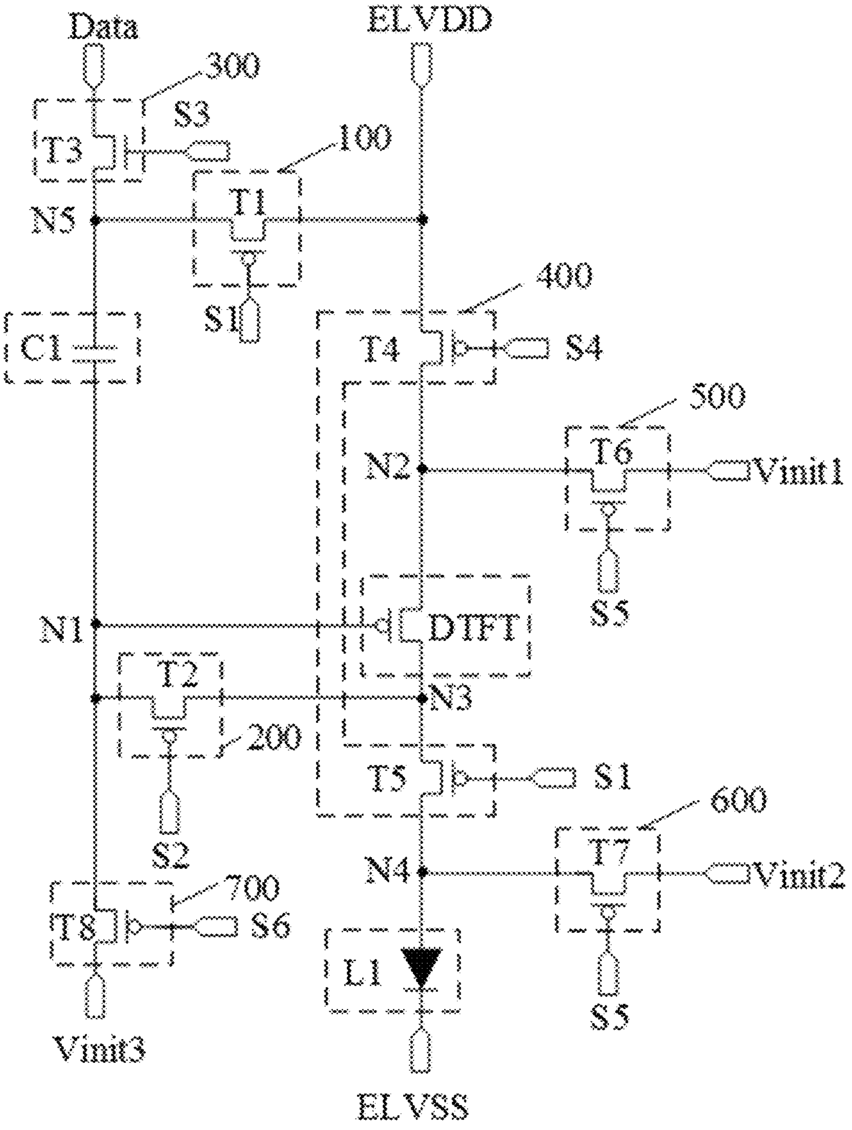
FIG. 5 shows another circuit connection diagram of a pixel driving circuit according to the embodiments of present disclosure.
Figure 6:
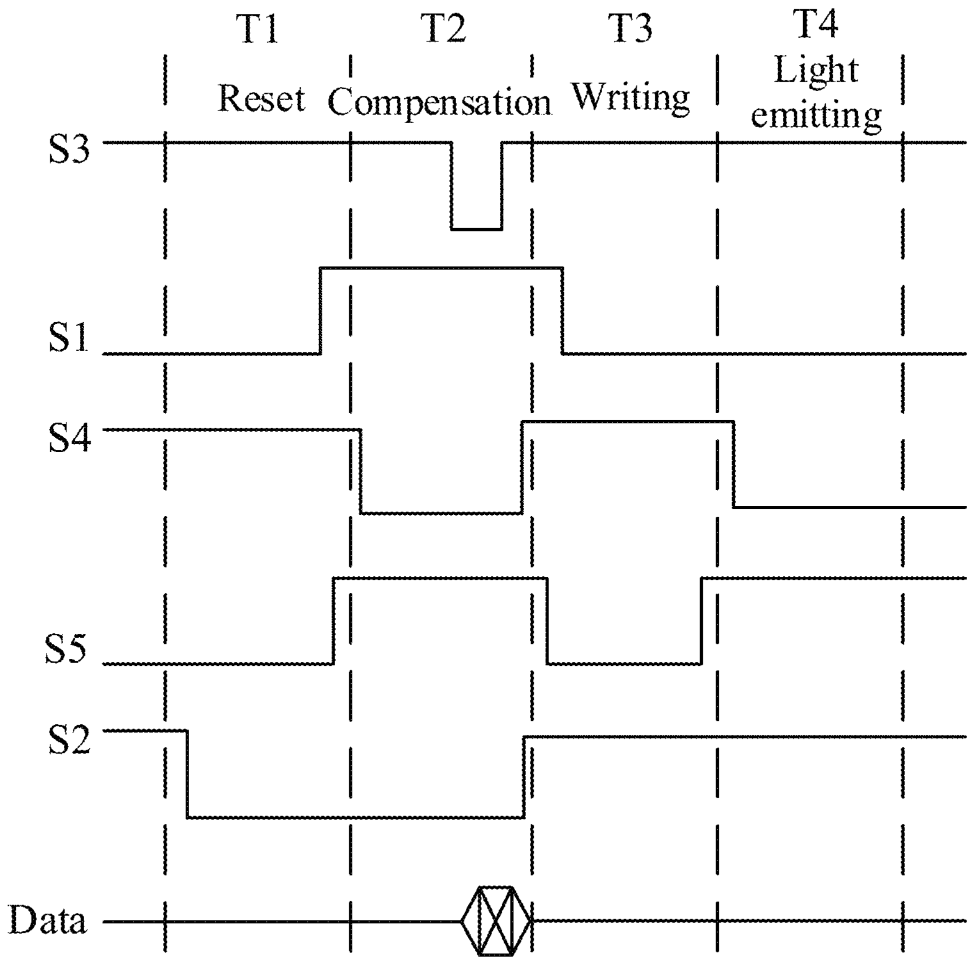
FIG. 6 shows a timing diagram of a pixel driving circuit according to the embodiments of the present disclosure.

Referring to FIG. 5, the above first initialization sub-circuit 500 includes: a sixth transistor T6.

The connection relationship between the sixth transistor T6 and other components in FIG. 5 is as follows: a control end of the sixth transistor T6 is coupled to the first reset signal terminal S5, a first end of the sixth transistor T6 is coupled to the first end of the driver transistor DTFT, and a second end of the sixth transistor T6 is coupled to the first initialization signal terminal Vinit1.

In the implementation process, when the signal at the first reset signal terminal S5 is at a low level, the sixth transistor T6 is conducted, and a first initialization signal of the first initialization signal terminal Vinit1 is provided to the first end of the driver transistor DTFT via the conducted sixth transistor T6, to reset the first end of the driver transistor DTFT.

In addition, the above pixel driving circuit further includes a second initialization sub-circuit 600. The second initialization sub-circuit 600 is coupled to the anode of the light-emitting device L1, and is configured to provide the signal at the second initialization signal terminal Vinit2 to the anode of the light-emitting device L1 in response to the signal at the second reset signal terminal S5.

Referring to FIG. 5, the above second initialization sub-circuit 600 includes: a seventh transistor T7.

The connection relationship between the seventh transistor T7 and other components in FIG. 5 is as follows: a control end of the seventh transistor T7 is coupled to the second reset signal terminal S5, a first end of the seventh transistor T7 is coupled to the anode of the light-emitting device L1, and a second end of the seventh transistor T7 is coupled to a second initialization signal terminal Vinit2.

In the implementation process, when the signal at the second reset signal terminal S5 is at a low level, the seventh transistor T7 is conducted, and a second initialization signal at the second initialization signal terminal Vinit2 is provided to the anode of the light-emitting device L1 via the conducted seventh transistor T7, to reset the anode of the light-emitting device L1.

In addition, the above pixel driving circuit further includes a third initialization sub-circuit 700. The third initialization sub-circuit 700 is coupled to the first end of the compensation capacitor C1, and is configured to provide a signal at a third initialization signal terminal Vinit3 to the first end of the compensation capacitor C1 in response to a signal at a third reset signal terminal S6.

Referring to FIG. 5, the above third initialization sub-circuit 700 includes: an eighth transistor T8.

The connection relationship between the eighth transistor T8 and other components in FIG. 5 is as follows: a control end of the eighth transistor T8 is coupled to a third reset signal terminal S6, a first end of the eighth transistor T8 is coupled to the first end of the compensation capacitor C1, and a second end of the eighth transistor T8 is coupled to the third initialization signal terminal Vinit3.

In the implementation process, when a signal at the third reset signal terminal S6 is at a low level, the eighth transistor T8 is conducted, and a third initialization signal at the third initialization signal terminal Vinit3 is provided to the first end of the compensation capacitor C1 via the conducted eighth transistor T8, to reset the first end of the compensation capacitor C1.

It should be added that a cathode of the above light-emitting device is coupled to a cathode power terminal ELVSS, and a voltage of the above cathode power terminal ELVSS is less than a voltage of the above power signal terminal ELVDD. The normal working of the light-emitting device L1 and the peripheral circuits can be guaranteed by setting the cathode power terminal ELVSS and the power signal terminal ELVDD.

The working process of the pixel driving circuit in the embodiments of the present application is described in detail below in conjunction with a timing diagram 6 and FIG. 3. At a reset phase, i.e., a timing sequence T1: S3=1, S1=0, S4=1, S5=0, and S2=0.

When S1 has a low-level signal, the first transistor T1 is conducted, and the signal at the power signal terminal ELVDD is provided to the fifth node N5. The above fifth node N5 is coupled to the second end of the compensation capacitor C1. At the same time, when S1 has a low-level signal, the fifth transistor T5 is conducted. When S5 has a low-level signal, the sixth transistor T6 is conducted, and the signal at the first initialization signal terminal Vinit1 is provided to the second node N2. The above second node N2 is coupled to the first end of the sixth transistor. At the same time, when S5 has a low-level signal, the seventh transistor T7 is conducted, the signal at the second initialization signal terminal Vinit2 is provided to the node N4, and the signal at the second initialization signal terminal Vinit2 is provided to the third node N3 via the fourth node N4 and the conducted fifth transistor T5. The above fourth node N4 is coupled to the anode of the light-emitting device, and the third node N3 is coupled to the second end of the driver transistor. Since the second transistor T2 is conducted when S2 has a low-level signal, the signal at the second initialization signal terminal Vinit2 is provided to the first node N1 via the third node N3 and the conducted second transistor T2. The above first node N1 is coupled to the gate of the driver transistor. When S2 has a low-level signal, the second transistor T2 is conducted, and the signal at the first initialization signal terminal Vinit1 is provided to the second node N2.

At a compensation phase, i.e., a timing sequence T2: S3=0, S1=1, S4=0, S5=1, and S2=0.

When S2 has a low-level signal, the second transistor T2 is conducted, and the driver transistor DTFT is conducted under the action of the signal of the second initialization signal terminal Vinit2 at the first node N1. When S4 has a low-level signal, the fourth transistor T4 is conducted, and a signal at the power signal terminal ELVDD is provided to the driver transistor DTFT via the conducted fourth transistor T4, so that a voltage of the gate of the driver transistor DTFT, i.e., the first end of the compensation capacitor C1, is changed to Vth+VELVDD. Herein, Vth is a threshold voltage of the driver transistor DTFT, and VELVDD is a voltage of the power signal terminal ELVDD. The time period of the first active level of the data writing sub-circuit 300 is within the time period of the second active level of the threshold compensation sub-circuit 200, i.e., a start time of the low level of S3 is later than a start time of a low level of S2 and a start time of a low level of S4. That is, when the above compensation is about to be completed, S3 is at a low-level signal, the third transistor T3 is conducted, and a data voltage at the data signal terminal Data is provided to the node N5, i.e., the second end of the compensation capacitor C1, via the conducted third transistor T3.

At a writing phase, i.e., a timing sequence T3: S3=1, S1=0, S4=0, S5=1, S2=1.

When S1 has a low-level signal, the first transistor T1 is conducted, and the signal of the power signal terminal ELVDD is written to the second end of the compensation capacitor C1 via the conducted first transistor T1 and the node N5. The voltage at the second end of the compensation capacitor C1 jumps to VELVDD from the data voltage of the data signal terminal Data, and the amount of voltage change is ELVDD−Data. Through the bootstrap effect of the above compensation capacitor C1, the amount of voltage change is coupled to the first end of the compensation capacitor C1, and the amount of voltage change at the first end of the compensation capacitor C1 is Vth+VELVDD+VELVDD−Data, i.e., Vth−Data, to write the data voltage of the data signal terminal Data to the first node N1, i.e., the gate of the driver transistor DTFT.

At a light-emitting phase, i.e., a timing sequence T4: S3=1, S1=0, S4=0, S5=1, S2=1.

When S1 has a low-level signal, the fifth transistor T5 is conducted. When S4 has a low-level signal, the fourth transistor T4 is conducted, and the driver transistor DTFT generates a drive current. For example, the drive current $Id=K*(VELVDD-Data)^2$, K is a constant, and the drive current is input into the light-emitting device L1, to further drive the light-emitting device L1 to emit light.

Figure 7:
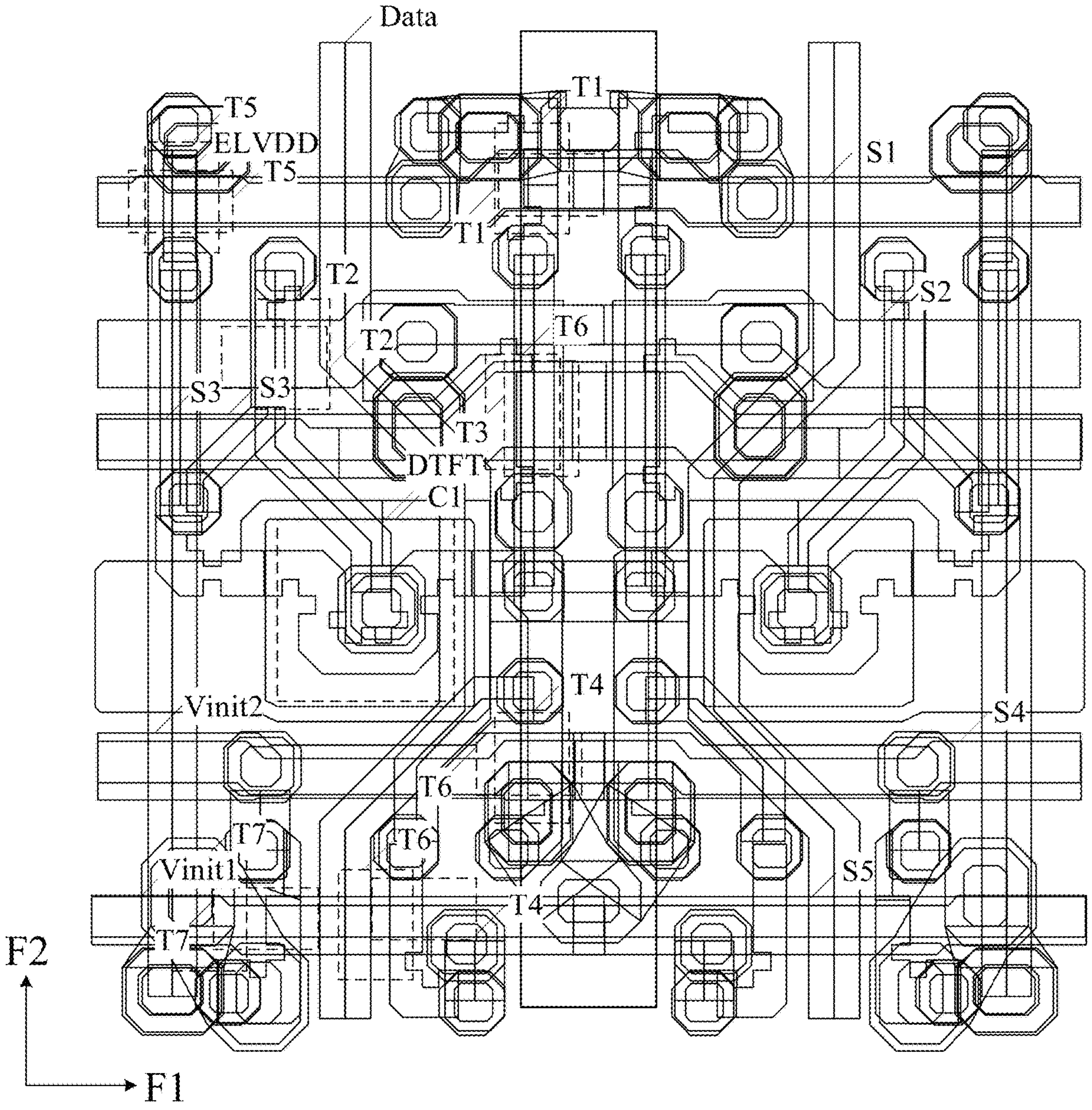
FIG. 7 shows a schematic diagram of a layout structure of a display panel according to the embodiments of the present disclosure.

Referring to FIG. 7, based on the same inventive concept, embodiments of the present disclosure provide a display panel, including a base substrate, the substrate includes a plurality of sub-pixels, and the sub-pixel includes the above any pixel driving circuit. The pixel driving circuit includes: a driver transistor, a first transistor, a third transistor, and a compensation capacitor. The first end of the first transistor is coupled to the second end of the compensation capacitor, the second end of the third transistor is coupled to the second end of the compensation capacitor, the gate of the driver transistor is coupled to the first end of the compensation capacitor, and an orthographic projection of an active layer of the third transistor on the base substrate is located between an orthographic projection of an active layer of the driver transistor on the base substrate and an orthographic projection of an active layer of the first transistor on the base substrate. That is, the active layer of the first transistor which is newly added in the present application are in the same layer as the active layer of the third transistor coupled to the second end of the compensation capacitor.

FIG. 7 shows a schematic diagram of a layout structure of a pixel driving circuit according to some embodiments of the present disclosure. FIG. 8 to FIG. 15 show schematic diagrams of layers of a pixel driving circuit according to some embodiments of the present disclosure. Herein, a pixel driving circuit of one sub-pixel is illustrated in FIG. 7 to FIG. 15. Herein, FIG. 7 to FIG. 15 also show a first signal line S1, a fifth signal line S5, and a power signal line electrically connected to the pixel driving circuit. Herein, the power signal line is configured to input a voltage VELVDD to the power signal terminal ELVDD. For example, a plurality of signal lines may be arranged along a first direction F1.

Figure 8:
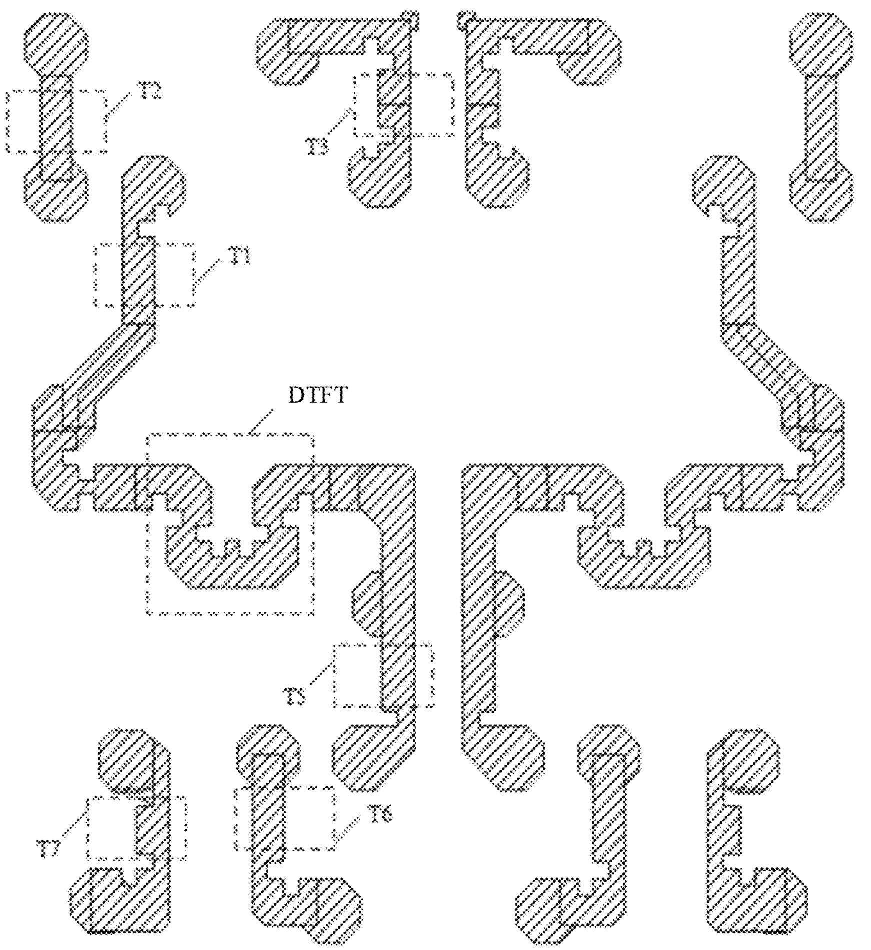
FIG. 8 shows a schematic diagram of a layout structure of a first semiconductor layer in a display panel according to the embodiments of the present disclosure.

For example, a first semiconductor layer of the pixel driving circuit is illustrated as shown in FIG. 7 to FIG. 8. The first semiconductor layer may be formed by patterning using the amorphous silicon and low temperature polysilicon (LTPS) materials. The first semiconductor layer may be used for fabricating the active layer of the first transistor T1, the active layer of the second transistor T2, the active layer of the third transistor T3, the active layer of the fifth transistor T5, the active layer of the sixth transistor T6, the active layer of the seventh transistor T7, and the active layer of the driver transistor DTFT described above. Each active layer may include a first region, a second region, and a first channel region between the first region and the second region. It is to be noted that the first region and the second region described above may be a conductive region formed by a region doped with an n-type impurity or a p-type impurity in the first semiconductor layer, so that the first region and the second region may be as a source region and a drain region of the active layer for electrical connection.

For example, as shown in FIG. 7 and FIG. 8, the active layer of the fifth transistor T5 may extend substantially in a straight line along a second direction F2. For example, an extension direction of the active layer of the fifth transistor T5 is substantially parallel to the second direction F2. It should be noted that in the actual process, due to the limitation of process conditions or other factors, the extension direction of the active layer of the fifth transistor T5 and the second direction are not completely parallel, and there may be some deviations. Therefore, the above extension direction of the active layer of the fifth transistor T5 and the second direction only need to substantially meet the parallel condition, which all fall within the scope of protection of the present disclosure. For example, the above parallelism can be the parallelism within the allowed error range.

Figure 9:
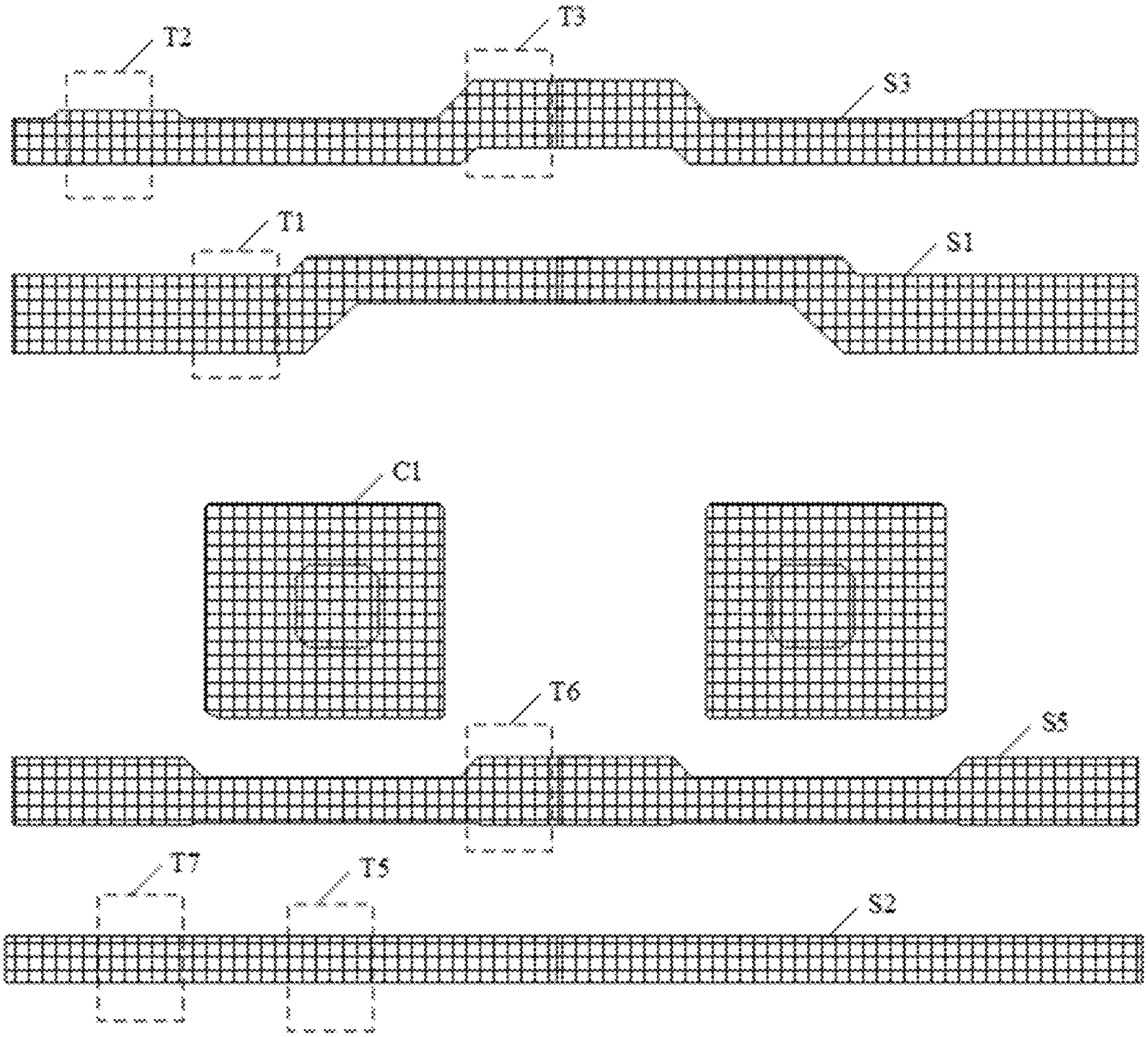
FIG. 9 shows a schematic diagram of a layout structure of a first conductive layer in a display panel according to the embodiments of the present disclosure.
Figure 10:
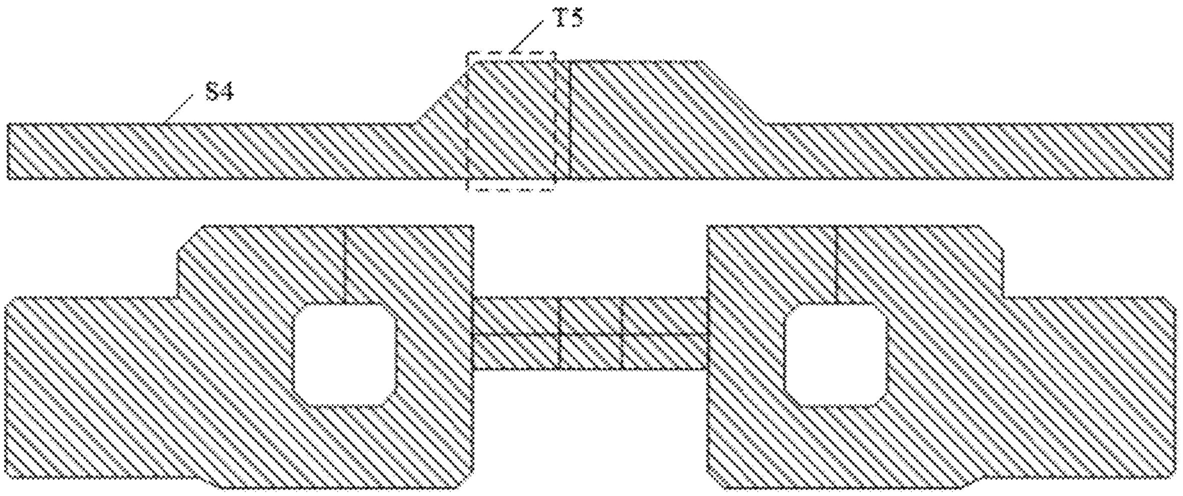
FIG. 10 shows a schematic diagram of a layout structure of a second conductive layer in a display panel according to the embodiments of the present disclosure.

For example, an insulating layer is formed on the above first semiconductor layer, for protecting the above first semiconductor layer. As shown in FIG. 9 and FIG. 10, a first conductive layer of the pixel driving circuit is illustrated. The first conductive layer is disposed at a side of the base substrate facing away from the first semiconductor layer, thereby insulating from the first semiconductor layer. The first conductive layer may include: a gate of the first transistor T1, a gate of the second transistor T2, a gate of the third transistor T3, a gate of the fifth transistor T5, a gate of the sixth transistor T6, a gate of the seventh transistor T7, a gate of the driver transistor DTFT, a first signal line S1, a second signal line S2, a third signal line S3, and a fifth signal line S5. For example, the gate of the first transistor T1 may be an overlapping portion of the first signal line S1 and the first semiconductor layer. The gate of the driver transistor DTFT may be an overlapping portion of the first end of the compensation capacitor C1 and the first semiconductor layer.

As shown in FIG. 10, a second conductive layer of the pixel driving circuit is illustrated, the second conductive layer is disposed at a side of the base substrate facing away from the first conductive layer, and an insulating layer is disposed between the first conductive layer and the second conductive layer. The above second conductive layer may include: the second end of the compensation capacitor C1, the gate of the third transistor, and the fifth signal line S5. For example, the gate of the third transistor T3 may be an overlapping portion of the fifth signal line S5 and the first semiconductor layer.

Figure 11:
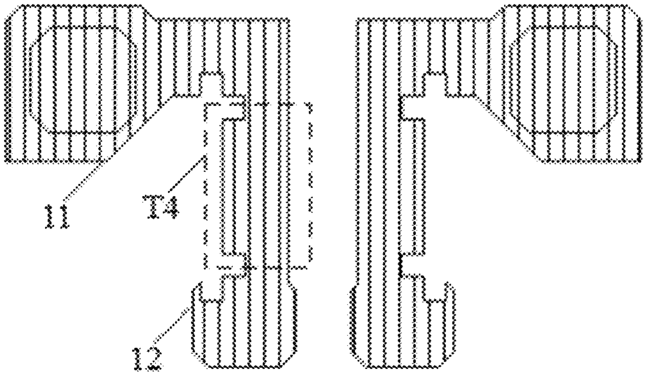
FIG. 11 shows a schematic diagram of a layout structure of a second semiconductor layer in a display panel according to the embodiments of the present disclosure.

As shown in FIG. 11, a second semiconductor layer of the pixel driving circuit is illustrated, the second semiconductor layer is disposed at a side of the base substrate facing away from the second conductive layer, and the second semiconductor layer may use a metal oxide semiconductor material. The second semiconductor layer may be used for fabricating the active layer of the third transistor T3 described above.

Moreover, an orthographic projection of the first signal line S1 on the base substrate and an orthographic projection of the active layer of the first transistor T1 on the base substrate have an overlapping region, i.e., the gate of the first transistor T1 may be an overlapping portion of the first signal line S1 and the first semiconductor layer, and the gate T7-G of the second reset transistor T7 may be an overlapping portion of a fourth scan line GA4 and the first semiconductor layer.

Referring to FIG. 11, the active layer of the above first transistor T1 includes a first active portion 11 and a second active portion 12, the first active portion 11 extends in a first direction F1, the second active portion 12 extends in a second direction F2, and the orthographic projection of the first signal line S1 on the base substrate and an orthographic projection of the first active portion 11 on the base substrate have an overlapping region. That is, an intersection exists between the first active portion 11 and the second active portion 12 of the above first transistor, and the above first active portion 11 and the second active portion 12 are arranged in two different directions, respectively. The first active portion 11 of the active layer of the first transistor T1 may be an overlapping portion of the first signal line S1 and the first semiconductor layer.

Figure 12:
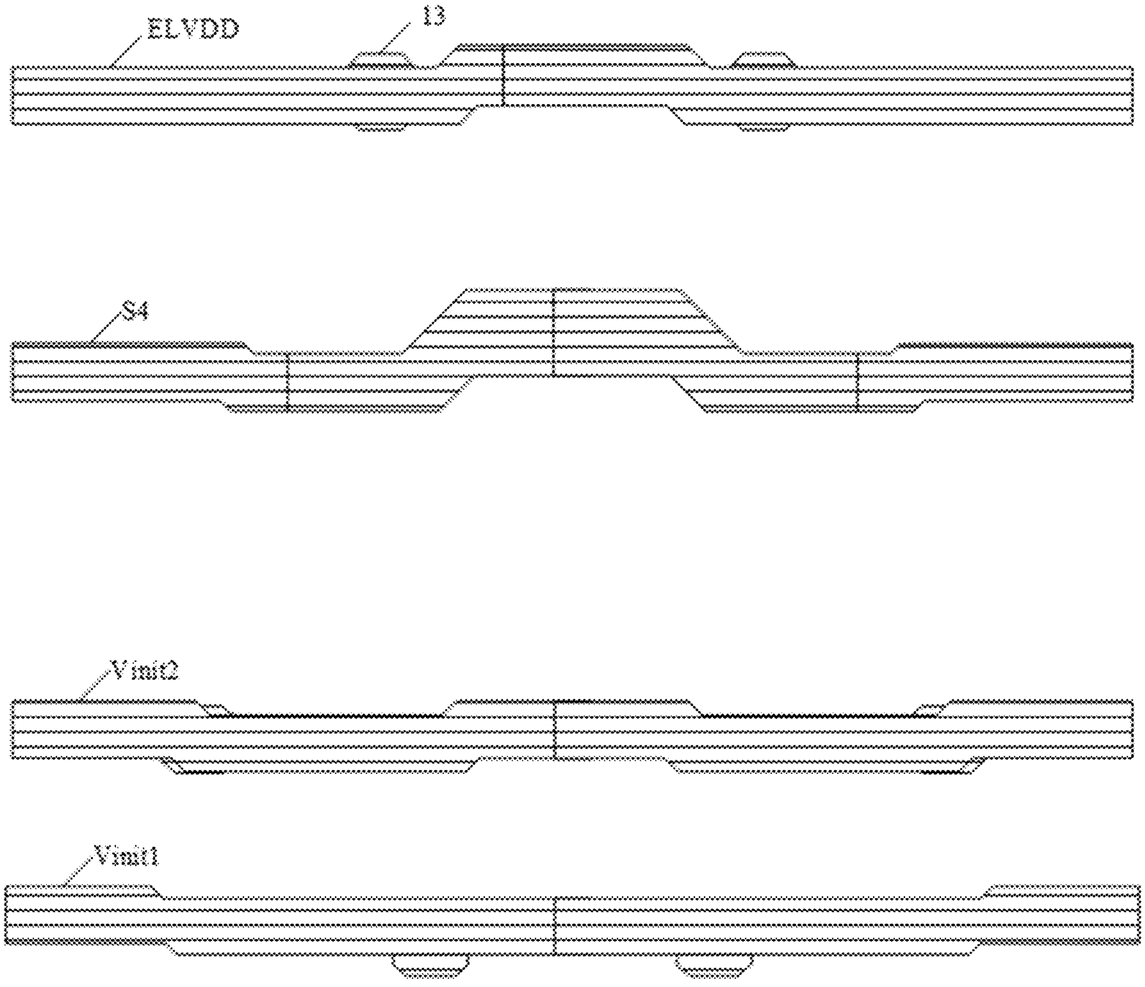
FIG. 12 shows a schematic diagram of a layout structure of a third conductive layer in a display panel according to the embodiments of the present disclosure.
Figure 13:
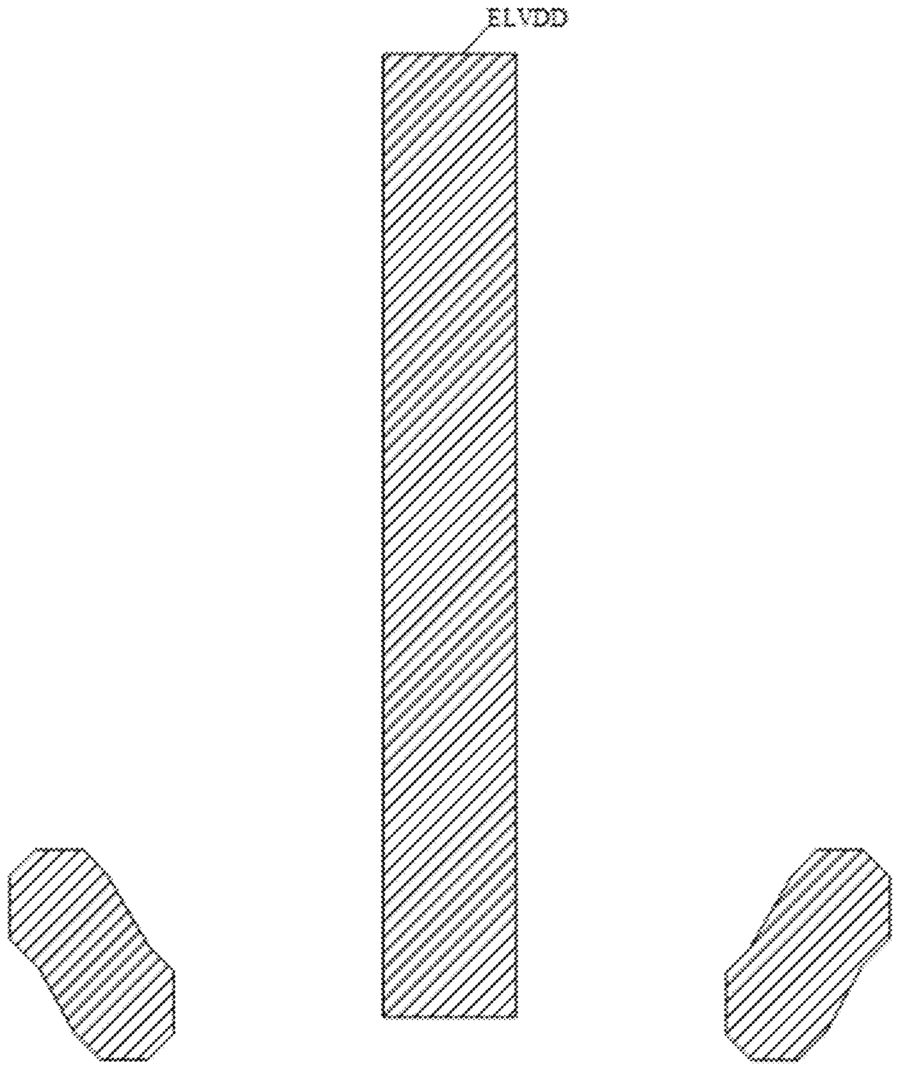
FIG. 13 shows a schematic diagram of a layout structure of a film layer including a power signal terminal in a display panel according to the embodiments of the present disclosure.

For example, as shown in FIG. 12, the base substrate further includes a third conductive layer. In the third conductive layer, the power signal line ELVDD, the fourth signal line S4, and the fifth signal line (Vinit2 and Vinit1 in FIG. 12) extend along the first direction F1. As shown in FIG. 13, the power signal line ELVDD is also arranged along the second direction F2. Herein, in the same sub-pixel, the power signal line ELVDD is a mesh connection structure. The above setting method may be designed and determined according to the needs of the actual application, and is not limited herein.

For example, the third conductive layer includes a first connection portion 13, the second conductive layer includes a second connection portion 14, a first insulating layer is provided between the third conductive layer and the second conductive layer, and a second insulating layer is provided between the second conductive layer and the first conductive layer. That is, in order to ensure the normal working of each of the conductive layers, an insulating layer is respectively provided between the first conductive layer, the second conductive layer, and the third conductive layer. In this way, the power signal line is connected to the second connection portion 14 through a first via passing through the first insulating layer, and the second connection portion is connected to the active layer of the first transistor T2 through a second via passing through the second insulating layer, i.e., conduction of the power signal line between the different conductive layers is realized.

Figure 14:
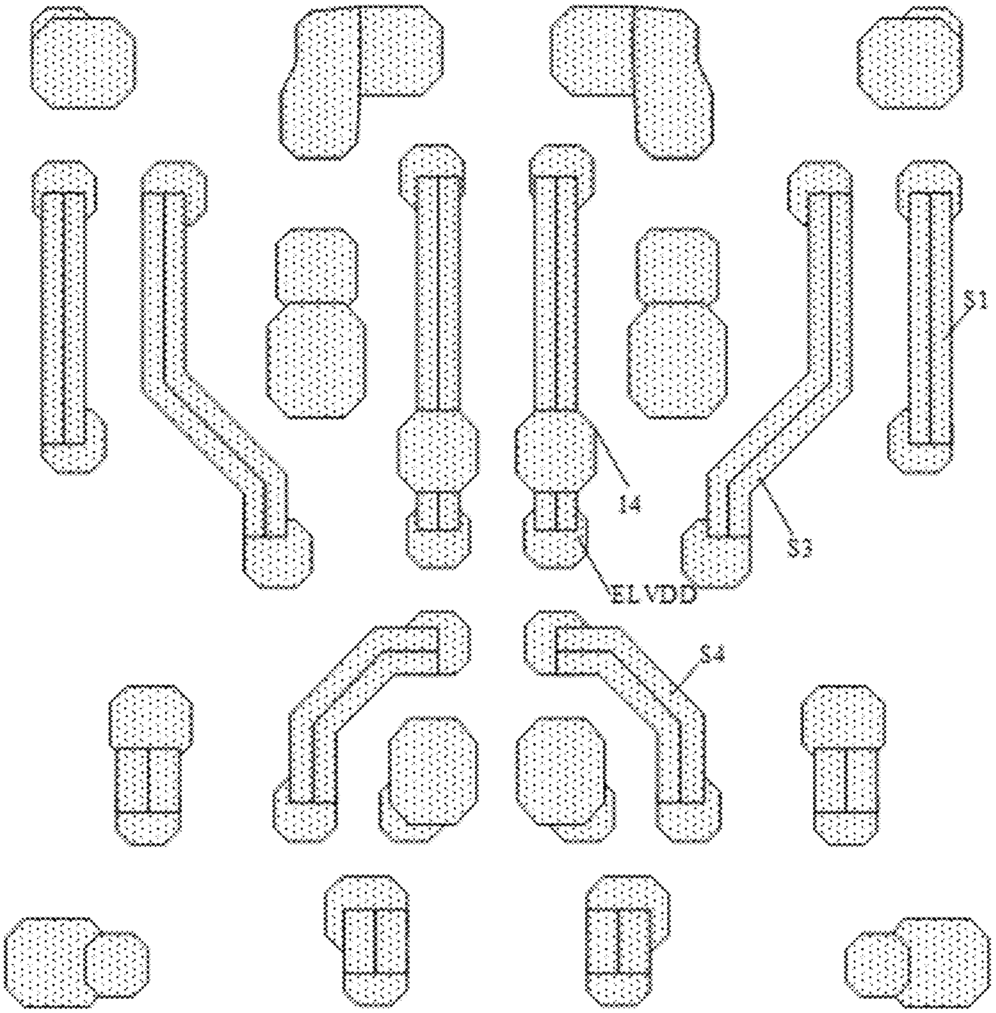
FIG. 14 shows a schematic diagram of a layout structure of a film layer including various connection lines in a display panel according to the embodiments of the present disclosure.
Figure 15:
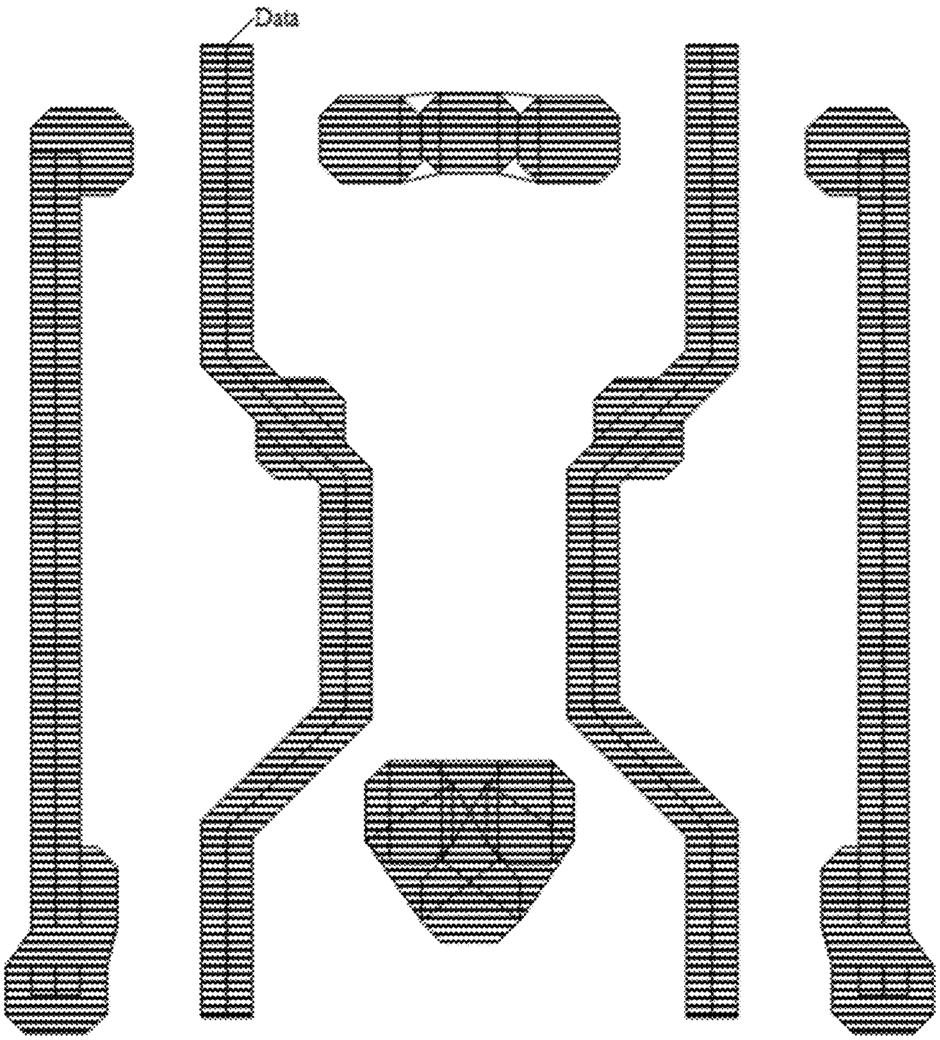
FIG. 15 shows another schematic diagram of a layout structure of a film layer including various connection lines in a display panel according to the embodiments of the present disclosure.

For example, as shown in FIG. 14, the power signal line ELVDD and the first signal line S1 extend in the second direction F2. A first portion of the third signal line S3 extends along the second direction F2, and a second portion of the third signal line S3 extends along a direction at an angle of 45 degrees to the lower left from the second direction F2. A portion of the fourth signal line S4 extends along the second direction F2, and another portion of the fourth signal line S4 extends along a direction at an angle of 45 degrees to the upper left from the second direction F2. For example, as shown in FIG. 15, the signal line connected to the anode of the light-emitting device extends along the second direction F2, and the signal line of the data signal terminal Data extends substantially along the second direction F2.

Figure 16:
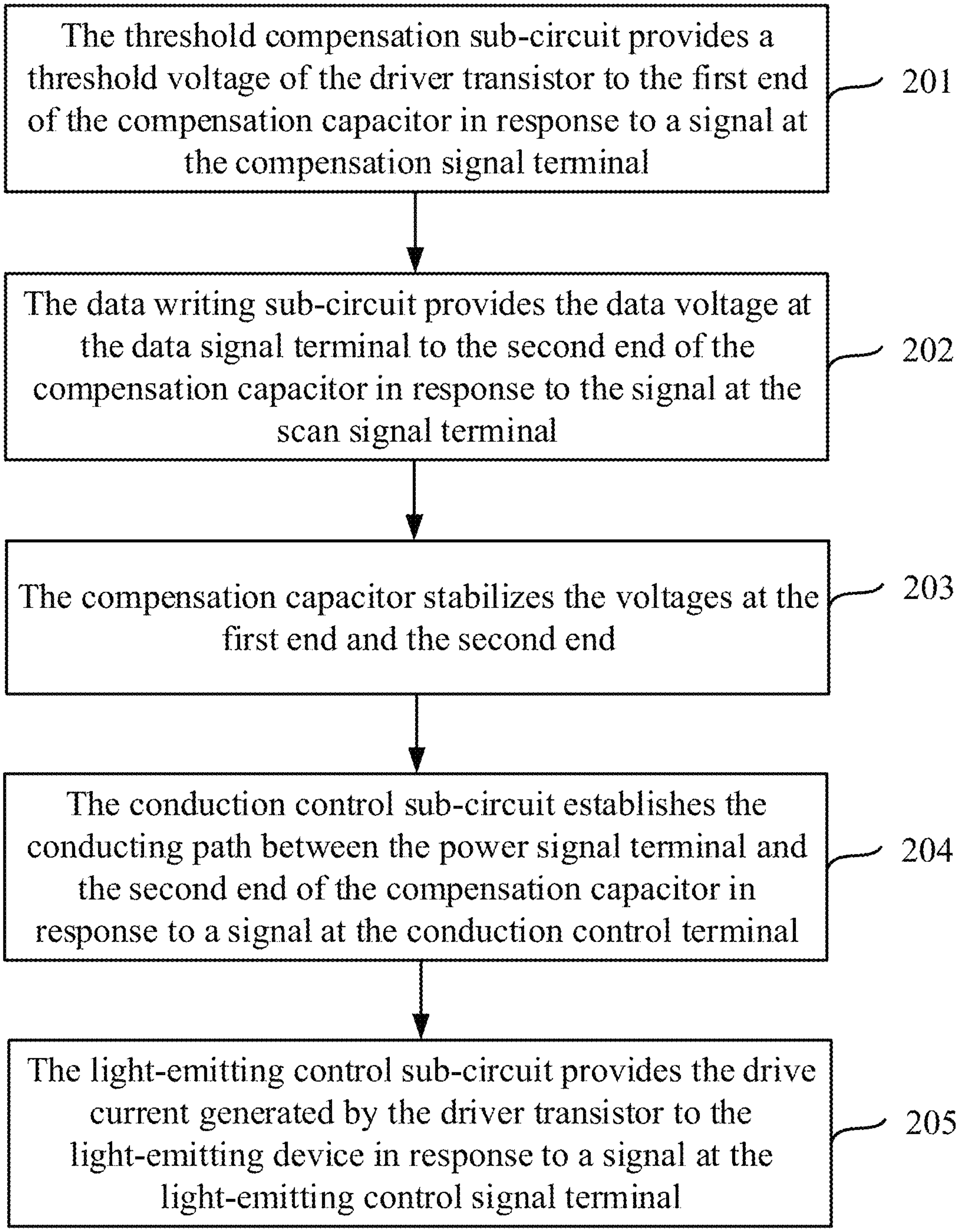
FIG. 16 shows a flowchart of a driving method of a pixel driving circuit according to the embodiments of the present disclosure.

Based on the same inventive concept, embodiments of the present disclosure provide a driving method for a pixel driving circuit, with reference to FIG. 16, including the following.

Step 201: the threshold compensation sub-circuit provides a threshold voltage of the driver transistor to the first end of the compensation capacitor in response to a signal at the compensation signal terminal.

In the implementation process, the second transistor is conducted when the signal at the compensation signal terminal is a low level, and the threshold voltage of the driver transistor is written to the first end of the compensation capacitor.

Step 202: the data writing sub-circuit provides the data voltage at the data signal terminal to the second end of the compensation capacitor in response to the signal at the scan signal terminal.

In the implementation process, when the signal at the scan signal terminal is a low level, the third transistor is conducted, and the data voltage at the data signal terminal is written to the second end of the compensation capacitor.

Step 203: the compensation capacitor stabilizes the voltages at the first end and the second end.

In the implementation process, the above compensation capacitor is mainly used for stabilizing the voltages at the first end and the second end thereof. Due to the voltage stabilizing effect of the compensation capacitor, the threshold voltage of the above driver transistor and the data voltage at the data signal terminal are then written to the gate of the driver transistor.

Step 204: the conduction control sub-circuit establishes the conducting path between the power signal terminal and the second end of the compensation capacitor in response to a signal at the conduction control terminal.

In the implementation process, when the signal at the conduction control terminal is a low level, the circuit connected to the light-emitting device is conducted, i.e., a conduction path is established between the power signal terminal and the second end of the compensation capacitor, and the driver transistor generates a drive current according to the threshold voltage and the data voltage.

Step 205: the light-emitting control sub-circuit provides the drive current generated by the driver transistor to the light-emitting device in response to a signal at the light-emitting control signal terminal.

In the implementation process, when the signal at the light-emitting control signal terminal is a low level, the light-emitting control sub-circuit is conducted, i.e., the drive current generated by the driver transistor DTFT is provided to the anode of the light-emitting device L1 to cause the light-emitting device L1 to emit light.

It should be added that the third transistor in the pixel driving circuit of the embodiments of the present application is an N-type transistor, and other transistors are P-type transistors. In other embodiments, the third transistor is a P-type transistor, and correspondingly, other transistors are N-type transistors.

In summary, in the embodiments of the present disclosure, a pixel driving circuit, a display panel and a driving method are provided. The pixel driving circuit includes: a driver transistor, a light-emitting device, a compensation capacitor, a threshold compensation sub-circuit, a data writing sub-circuit, a conduction control sub-circuit, and a light-emitting control sub-circuit. The threshold compensation sub-circuit provides a threshold voltage of the driver transistor to the first end of the compensation capacitor in response to a signal at the compensation signal terminal. The data writing sub-circuit provides the data voltage at the data signal terminal to the second end of the compensation capacitor in response to the signal at the scan signal terminal. The conduction control sub-circuit establishes the conducting path between the power signal terminal and the second end of the compensation capacitor in response to the signal at the conduction control terminal. The light-emitting control sub-circuit provides the drive current generated by the driver transistor to the light-emitting device in response to the signal at the light-emitting control signal terminal. The setting of the compensation capacitor realizes the time division of the threshold compensation and the data writing, which realizes the high-frequency refresh while satisfying the display of the light-emitting device.

It should be appreciated by those skilled in the art that embodiments of the present disclosure may be provided as methods, systems, or computer program product systems. Therefore, the present disclosure may take a form of a fully hardware embodiment, a fully software embodiment, or an embodiment that combines software and hardware aspects. Further, the present disclosure may take a form of a computer program product system implemented on one or more computer-usable storage media (including, but not limited to, a disk memory, a compact disc read-only memory (CD-ROM), an optical memory, and the like) that contain computer-usable program codes therein.

The present disclosure is described with reference to flowcharts and/or block diagrams of methods, devices (systems), and computer program product systems of the present disclosure. It is to be understood that each process and/or box in the flowchart and/or block diagram, and the combination of processes and/or boxes in the flowchart and/or block diagram, may be implemented by computer program instructions. These computer program instructions may be provided to processor(s) of a general-purpose computer, a special-purpose computer, an embedded processor, or other programmable data processing device to produce a machine, such that the instructions executed by the processor of the computer or other programmable data processing device produce an apparatus for implementing the functions specified in one or more processes of the flowchart and/or one or more boxes in the block diagram.

These computer program instructions may also be stored in a computer-readable memory capable of directing the computer or other programmable data processing device to operate in a particular manner, such that the instructions stored in the computer-readable memory produce an article of manufacture including an instruction device that implements the function specified in one or more processes in the flowchart and/or one or more boxes in the block diagram.

These computer program instructions may also be loaded onto a computer or other programmable data processing device, such that a series of operational steps are performed on the computer or other programmable device to produce computer-implemented processing, such that the instructions executed on the computer or other programmable device provide steps for implementing the function specified in one or more processes in the flowchart and/or one or more boxes in the block diagram.

Obviously, those skilled in the art can make various changes and variations to the present disclosure without departing from the spirit and scope of the present disclosure. Thus, if such modifications and variations of the present disclosure are within the scope of the claims of the present disclosure and their technical equivalents, the present disclosure is intended to encompass such modifications and variations.

What is claimed is:

1. A pixel driving circuit, comprising: a driver transistor, a light-emitting device, a compensation capacitor, a threshold compensation sub-circuit, a data writing sub-circuit, a conduction control sub-circuit, and a light-emitting control sub-circuit;

wherein the threshold compensation sub-circuit is mutually coupled to a gate of the driver transistor and a first end of the compensation capacitor, and is configured to provide a threshold voltage of the driver transistor to the first end of the compensation capacitor in response to a signal at a compensation signal terminal;

the data writing sub-circuit is coupled to a second end of the compensation capacitor, and is configured to provide a data voltage at a data signal terminal to the second end of the compensation capacitor in response to a signal at a scan signal terminal;

the compensation capacitor is configured to stabilize voltages at the first end and the second end;

the conduction control sub-circuit is coupled to the second end of the compensation capacitor and a power signal terminal, and is configured to establish a conducting path between the power signal terminal and the second end of the compensation capacitor in response to a signal at a conduction control terminal; and the light-emitting control sub-circuit is coupled to the driver transistor and the light-emitting device, and is configured to provide a drive current generated by the driver transistor to the light-emitting device in response to a signal at a light-emitting control signal terminal.

2. The pixel driving circuit according to claim 1, wherein the conduction control sub-circuit comprises: a first transistor;

wherein a control end of the first transistor is coupled to the conduction control terminal, a first end of the first transistor is coupled to the second end of the compensation capacitor, and a second end of the first transistor is coupled to the power signal terminal.

3. The pixel driving circuit according to claim 1, wherein the data writing sub-circuit provides the data voltage at the data signal terminal to the second end of the compensation capacitor in response to a first active level of the signal at the scan signal terminal; and the threshold compensation sub-circuit provides the threshold voltage of the driver transistor to the first end of the compensation capacitor in response to a second active level of the signal at the compensation signal terminal;

wherein a time period corresponding to the first active level is provided within a time period corresponding to the second active level.

4. The pixel driving circuit according to claim 3, wherein a duration in which the first active level is high is less than a duration in which the second active level is low.

5. The pixel driving circuit according to claim 1, wherein the threshold compensation sub-circuit comprises: a second transistor;

wherein a control end of the second transistor is coupled to the compensation signal terminal, a first end of the second transistor is coupled to the first end of the compensation capacitor, and a second end of the second transistor is coupled to a second end of the driver transistor.

6. The pixel driving circuit according to claim 1, wherein the data writing sub-circuit comprises: a third transistor;

wherein a control end of the third transistor is coupled to the scan signal terminal, a first end of the third transistor is coupled to the data signal terminal, and a second end of the third transistor is coupled to the second end of the compensation capacitor.

7. The pixel driving circuit according to claim 1, wherein the light-emitting control sub-circuit comprises: a fourth transistor and a fifth transistor;

a control end of the fourth transistor is coupled to the light-emitting control signal terminal, a first end of the fourth transistor is coupled to the power signal terminal, and a second end of the fourth transistor is coupled to a first end of the driver transistor; and a control end of the fifth transistor is coupled to the conduction control terminal, a first end of the fifth transistor coupled to a second end of the driver transistor, and a second end of the fifth transistor is coupled to an anode of the light-emitting device.

8. The pixel driving circuit according to claim 1, further comprising a first initialization sub-circuit;

wherein the first initialization sub-circuit is coupled to a first end of the driver transistor, and is configured to provide a signal at a first initialization signal terminal to the first end of the driver transistor in response to a signal at a first reset signal terminal.

9. The pixel driving circuit according to claim 8, wherein the first initialization sub-circuit comprises: a sixth transistor;

wherein a control end of the sixth transistor is coupled to the first reset signal terminal, a first end of the sixth transistor is coupled to the first end of the driver transistor, and a second end of the sixth transistor is coupled to the first initialization signal terminal.

10. The pixel driving circuit according to claim 1, further comprising a second initialization sub-circuit;

wherein the second initialization sub-circuit is coupled to an anode of the light-emitting device, and is configured to provide a signal at a second initialization signal terminal to the anode of the light-emitting device in response to a signal at a second reset signal terminal.

11. The pixel driving circuit according to claim 10, wherein the second initialization sub-circuit comprises: a seventh transistor;

wherein a control end of the seventh transistor is coupled to the second reset signal terminal, a first end of the seventh transistor is coupled to the anode of the light-emitting device, and a second end of the seventh transistor is coupled to the second initialization signal terminal.

12. The pixel driving circuit according to claim 1, further comprising a third initialization sub-circuit;

wherein the third initialization sub-circuit is coupled to the first end of the compensation capacitor, and is configured to provide a signal at a third initialization signal terminal to the first end of the compensation capacitor in response to a signal at a third reset signal terminal.

13. The pixel driving circuit according to claim 12, wherein the third initialization sub-circuit comprises: an eighth transistor;

wherein a control end of the eighth transistor is coupled to the third reset signal terminal, a first end of the eighth transistor is coupled to the first end of the compensation capacitor, and a second end of the eighth transistor is coupled to the third initialization signal terminal.

14. A display panel, comprising:

a base substrate, comprising a plurality of sub-pixels; wherein the sub-pixel comprises the pixel driving circuit according to claim 1;

wherein the pixel driving circuit comprises: the driver transistor, a first transistor, a third transistor, and the compensation capacitor;

a first end of the first transistor is coupled to the second end of the compensation capacitor, a second end of the third transistor is coupled to the second end of the compensation capacitor, and the gate of the driver transistor is coupled to the first end of the compensation capacitor; and an orthographic projection of an active layer of the third transistor on the base substrate is located between an orthographic projection of an active layer of the driver transistor on the base substrate and an orthographic projection of an active layer of the first transistor on the base substrate.

15. The display panel according to claim 14, wherein the display panel comprises: a first semiconductor layer, a first conductive layer, a second conductive layer, and a second semiconductor layer;

the first semiconductor layer on the base substrate comprises the active layer of the first transistor and the active layer of the driver transistor;

the first conductive layer is disposed at a side of the base substrate facing away from the first semiconductor layer, and comprises a gate of the first transistor, the gate of the driver transistor and a first signal line;

the second conductive layer is disposed at a side of the base substrate facing away from the first conductive layer, and comprises the second end of the compensation capacitor, a gate of the third transistor and a fifth signal line; and the second semiconductor layer is disposed at a side of the base substrate facing away from the second conductive layer, and comprises the active layer of the third transistor.

16. The display panel according to claim 14, wherein an orthographic projection of the first signal line on the base substrate and an orthographic projection of the active layer of the first transistor on the base substrate have an overlapping region; and the first signal line in the overlapping region serves as a gate of the first transistor.

17. The display panel according to claim 16, wherein the active layer of the first transistor comprises a first active portion and a second active portion, the first active portion extends in a first direction, and the second active portion extends in a second direction;

wherein the orthographic projection of the first signal line on the base substrate and an orthographic projection of the first active portion on the base substrate have the overlapping region.

18. The display panel according to claim 16, further comprising a third conductive layer;

wherein the third conductive layer is disposed at a side of the base substrate facing away from a second semiconductor layer, the third conductive layer comprises a power signal line connected to the power signal terminal, and the power signal line covers the overlapping region.

19. The display panel according to claim 18, wherein the third conductive layer comprises a first connection portion, the second conductive layer comprises a second connection portion, a first insulating layer is provided between the third conductive layer and the second conductive layer, and a second insulating layer is provided between the second conductive layer and the first conductive layer;

the power signal line is connected to the second connection portion through a first via passing through the first insulating layer; and the second connection portion is connected to the active layer of the first transistor through a second via passing through the second insulating layer.

20. A driving method for the pixel driving circuit according to claim 1, comprising:

providing, by the threshold compensation sub-circuit, the threshold voltage of the driver transistor to the first end of the compensation capacitor in response to the signal at the compensation signal terminal;

providing, by the data writing sub-circuit, the data voltage at the data signal terminal to the second end of the compensation capacitor in response to the signal at the scan signal terminal;

stabilizing, by the compensation capacitor, the voltages at the first end and the second end;

establishing the conducting path between the power signal terminal and the second end of the compensation capacitor by the conduction control sub-circuit, in response to the signal at the conduction control terminal; and providing, by the light-emitting control sub-circuit, the drive current generated by the driver transistor to the light-emitting device in response to the signal at the light-emitting control signal terminal.

* * * * *